US006740597B1

(12) United States Patent
Torek et al.

(10) Patent No.: US 6,740,597 B1
(45) Date of Patent: May 25, 2004

(54) METHODS OF REMOVING AT LEAST SOME OF A MATERIAL FROM A SEMICONDUCTOR SUBSTRATE

(75) Inventors: Kevin J. Torek, Meridian, ID (US); Garo J. Derderian, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/653,157

(22) Filed: Aug. 31, 2000

(51) Int. Cl.[7] ................. H01L 21/302; H01L 21/461
(52) U.S. Cl. .................. 438/725; 134/1.1; 134/1.2
(58) Field of Search ................ 438/328, 329, 438/330, 708, 715, 725; 134/1–3, 20, 31, 38, 39; 156/344, 345

(56) References Cited

U.S. PATENT DOCUMENTS

| 4,885,047 A | * 12/1989 | Ury et al. ............... 156/345 |
| 5,540,047 A | * 7/1996 | Dahlheim et al. ......... 60/274 |
| 5,632,868 A | * 5/1997 | Harada et al. ........... 204/176 |
| 5,683,857 A | * 11/1997 | Shirai et al. ............ 430/326 |
| 5,810,978 A |   9/1998 | Nakatsuka et al. |
| 6,133,603 A | * 10/2000 | Nomoto ................. 257/315 |
| 6,306,564 B1 | * 10/2001 | Mullee .................. 430/329 |

FOREIGN PATENT DOCUMENTS

| JP | 9-241007 | 9/1997 |
| JP | 11219926 | * 8/1999 | ......... H01L/21/304 |

OTHER PUBLICATIONS

Abstract of Article: Voigt, K. et al., "A Little Nitrogen Goes a Long Way in Ozone Production . . . Or The Addition of Nitrogen Gas to Pure Oxygen Ozone Generation to Achieve Greater Generator Efficiency", 1994 Annual Conf. Proceedings, American Water Works Assn., New York, NY, Jun. 19–23, 1994, pp. 885–900.

* cited by examiner

Primary Examiner—Robert Kunemund
Assistant Examiner—Duy-Vu Deo
(74) Attorney, Agent, or Firm—Wells St. John P.S.

(57) ABSTRACT

The invention encompasses a method of removing at least some of a material from a semiconductor substrate. A feed gas is fed through an ozone generator to generate ozone. The feed gas comprises at least 99.999% $O_2$ (by volume). The ozone, or a fragment of the ozone, is contacted with a material on a semiconductor substrate to remove at least some of the material from the semiconductor substrate. The invention also encompasses another method of removing at least some of a material from a semiconductor substrate. A mixture of ozone and organic solvent vapors is formed in a reaction chamber. At least some of the ozone and solvent vapors are contacted with a material on a semiconductor substrate to remove at least some of the material from the semiconductor substrate.

30 Claims, 2 Drawing Sheets

METHODS OF REMOVING AT LEAST SOME OF A MATERIAL FROM A SEMICONDUCTOR SUBSTRATE

TECHNICAL FIELD

The invention pertains to methods of forming and utilizing ozone to remove at least some of a material from a semiconductor substrate. In particular applications, the invention pertains to methods of utilizing organic material vapors in combination with ozone to remove materials from semiconductor substrates.

BACKGROUND OF THE INVENTION

It is common to utilize ozone for removing materials from over semiconductor substrates during semiconductor device fabrication. For instance, ozone can be utilized for removing photoresist and other organic materials. The ozone is typically generated proximate to, or within, a reaction chamber. The semiconductor substrate is provided within the reaction chamber, and the ozone is contacted with the material which is to be removed.

Ozone can be utilized for removing organic materials, such as, for example, photoresist, in that the ozone can oxidize the organic material and thereby convert the organic material to a form which is more readily removed from over a semiconductor substrate than was the organic material prior to oxidation.

A method of forming ozone is to feed a diatomic oxygen ($O_2$) containing feed gas into an ozone generator. The feed gas is generally about 99.9% $O_2$ (by volume), with the remaining 0.1% of the feed gas comprising mostly nitrogen ($N_2$). Occasionally, additional nitrogen may be spiked into the feed gas to raise a concentration of nitrogen up to about 5%. A reason for utilizing the relatively low purity oxygen as a feed gas for generating ozone is that it can be cheaper than higher purity oxygen. Another reason is that there can be a reduced risk of flame or explosion in utilizing a lower purity oxygen, relative to that which would exist in utilizing a higher purity oxygen.

The invention encompasses new methods of forming and utilizing ozone in removing materials from over semiconductor substrates.

SUMMARY OF THE INVENTION

The invention encompasses a method of removing at least some of a material from a semiconductor substrate. A feed gas is fed through an ozone generator to generate ozone. The feed gas comprises at least 99.999% $O_2$ (by volume). The ozone, or a fragment of the ozone, is contacted with a material on a semiconductor substrate to remove at least some of the material from the semiconductor substrate.

In another aspect, the invention encompasses another method of removing at least some of a material from a semiconductor substrate. A mixture of ozone and organic solvent vapors is formed in a reaction chamber. At least some of the ozone and solvent vapors are contacted with a material on a semiconductor substrate to remove at least some of the material from the semiconductor substrate.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
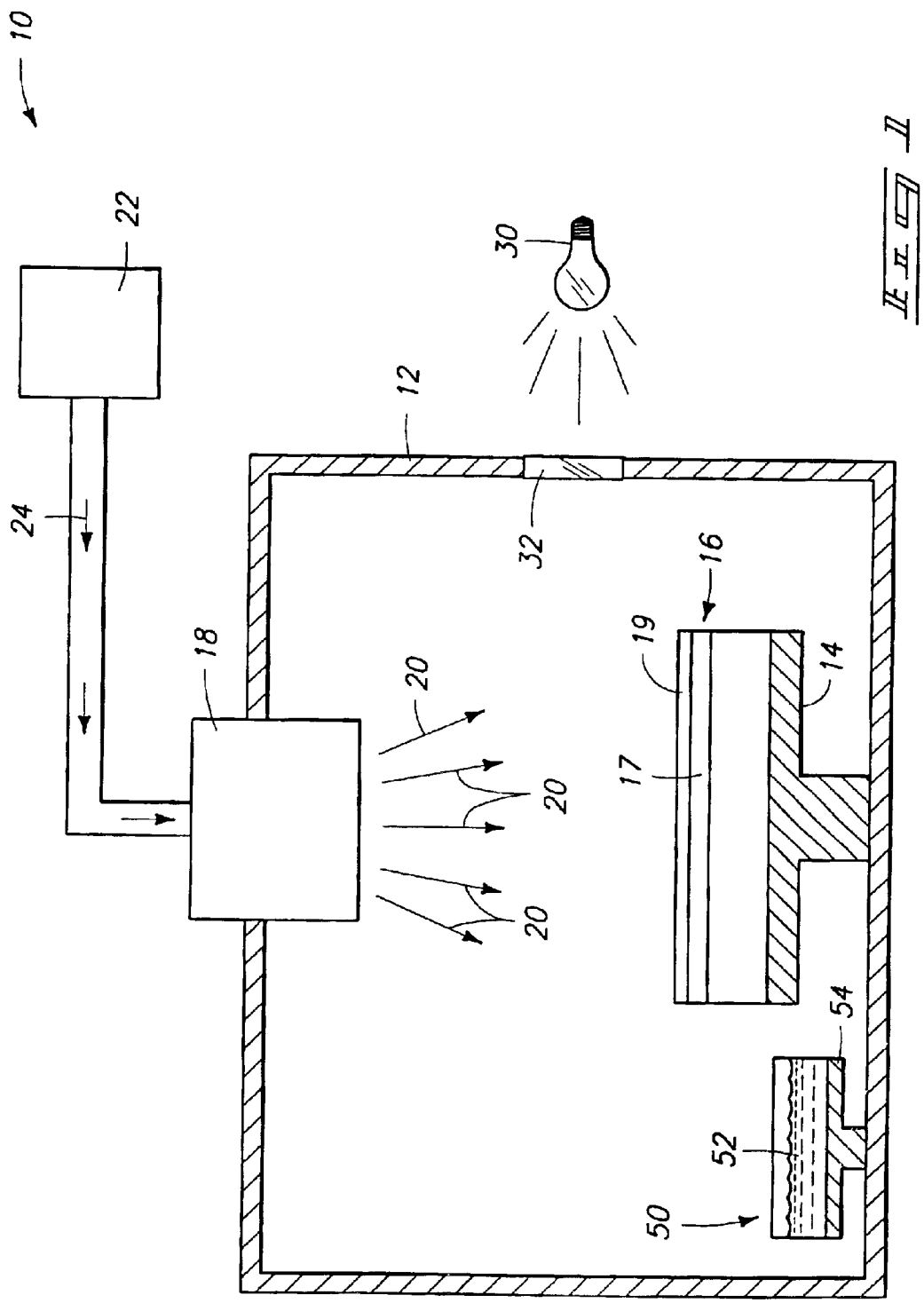
FIG. 1 is a diagrammatic, cross-sectional view of a reaction chamber utilized in accordance with a method of the present invention.

Methodology encompassed by the present invention is described with reference to FIGS. 1–3. Referring initially to FIG. 1, an apparatus 10 is diagrammatically illustrated. Apparatus 10 comprises a reaction chamber 12 having a semiconductor wafer support 14 therein. A semiconductor wafer 16 is shown on support 14.

An ozone generator 18 is shown mounted relative to chamber 12 such that ozone 20 formed within generator 18 is expelled into chamber 12. An exemplary ozone generator is an ASTEX™ 8200, which is manufactured by Applied Science and Technology, of 3500 Cabot Rd, Woburn, Mass. It is to be understood that ozone generator 18 can be mounted outside of chamber 12, and ozone flowed from generator 18 into chamber 12. It is also to be understood that ozone generator 18 could be mounted such that it is fully enclosed within chamber 12. Further, it is to be understood that ozone generator 18 can be mounted above wafer 16, as shown, or can be mounted in other orientations relative to wafer 16.

A feed gas source 22 is provided externally of chamber 12, and a feed gas 24 is flowed from source 22 to ozone generator 18. Feed gas 24 comprises $O_2$, and in contrast to the prior art preferably comprises at least 99.999% $O_2$ (by volume). Feed gas 24 is flowed into ozone generator 18 to form ozone 20. An advantage of utilizing a feed gas with a higher purity of oxygen than the prior art is that such reduces a concentration of nitrogen within the feed gas. In accordance with one aspect of the invention, it is recognized that nitrogen can be converted to various nitrous oxides ($NO_x$) upon being passed with oxygen through an ozone generator. The nitrous oxides can be corrosive and otherwise damaging to integrated circuitry exposed to the nitrous oxides. Further, the nitrous oxides can form various acids (such as, for example, $HNO_3$) which can be corrosive to various integrated circuitry materials, such as, for example, aluminum oxide ($Al_2O_3$). Accordingly, one aspect of the invention encompasses utilization of a higher purity oxygen in an ozone-generating feed gas than that which is utilized in the prior art. A related aspect of the invention is that such utilizes an ozone-generating feed gas having less nitrogen than prior art feed gases. Preferably, the ozone-generating feed gas 24 comprises less than or equal to 0.001% $N_2$ (by volume).

Semiconductor substrate 16 comprises an upper layer 17. Semiconductor substrate 16 can comprise, for example, monocrystalline silicon lightly-doped with a background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Upper layer 17 can comprise, for example, aluminum oxide ($Al_2O_3$), platinum, or other materials associated with fabrication of integrated circuitry.

A layer 19 is over upper layer 17 of semiconductor substrate 16, and comprises a material which is to be removed. Layer 19 can comprise, for example, photoresist, such as, for example, a so-called I-line photoresist (typically a novolac resin), or a deep ultraviolet resist. Alternatively, layer 19 can comprise other organic materials.

Ozone 20 is utilized to remove at least some of layer 19 from over semiconductor substrate 16. In other words, the ozone is utilized to remove a material defined by layer 19 from over the upper layer 17 of semiconductor substrate 16.

In one aspect, ozone 20 flows to material 19 to react with the material and form a product which can be removed from over semiconductor substrate 16. For instance, ozone 20 can oxidize an organic material 19 to form a relatively volatile material which can be swept from over layer 17 by flow of gases through reaction chamber 12.

In another aspect, ozone 20 can be broken into reactive fragments which contact material 19 and react with the material to form a product which can be removed from over layer 17. In the shown embodiment, an ultraviolet light source 30 is provided proximate reaction chamber 12 and adjacent a window 32 which extends through a wall of reaction chamber 12. Ultraviolet light generated by source 30 passes through window 32 into chamber 12. The ultraviolet light can then impact ozone 20 within chamber 12 to cause the ozone to break into reactive fragments. Such reactive fragments can comprise, for example, atomic oxygen. The fragments formed from the ozone can also comprise $O_2$. In embodiments in which ozone 20 is exposed to ultraviolet light prior to contact of the ozone or fragments thereof with material 19, such exposure preferably occurs proximate layer 19. In such context, the term "proximate" means that the exposure occurs within one foot of layer 19. Such can alleviate losses of the reactive species formed by the exposure prior to interaction of the reactive species with layer 19. In particular aspects of the invention, the ultraviolet light can be shined onto a surface of layer 19 while the surface is exposed to ozone.

The apparatus 10 of FIG. 1 further comprises a reservoir 50 comprising a volatile material 52. Reservoir 50 is on a reservoir holder 54 which can comprise a heater. In operation, material 52 is volatilized from reservoir 50 to form vapor within reaction chamber 12 which can enhance removal of material 19 by ozone 20. Volatile material 52 can comprise, for example, water, and accordingly the vapor formed within the reaction chamber 12 will be water vapor. Alternatively, volatile material 52 could comprise an organic solvent such as, for example, one or more of cyclohexanone, acetone, or propylene glycol methylether acetate (PGMEA). In particular embodiments, the solvent can consist essentially of, or consist of, acetone. In other embodiments, the solvent can consist essentially of, or consist of, cyclohexanone. In yet other embodiments, the solvent can consist essentially of, or consist of, a mixture of cyclohexanone and PGMEA. A particular solvent can comprise a mixture of 60% cyclohexanone and 40% PGMEA. An alternative solvent is propylene glycol. Although the solvents described above would be liquid materials, it is to be understood that reservoir 50 could also comprise a volatile solid material.

If the material 52 is volatile at a temperature within reactor 12, vapors will be formed from material 52 without additional heating of the material. Alternatively, if material 52 is not volatile at the temperature of reaction chamber 12, or if it desired to enhance volatilization of material 52, the material can be heated by, for example, a heater within support 54.

If material 52 comprises a volatile organic material, then the vapors formed from material 52 will be volatile organic solvent vapors. It is to be understood that within the context of this document the term "solvent vapor" refers to a vapor formed from a volatile organic material, and not to any volatile organic materials formed by degradation of layer 19 within chamber 12. If volatile solvent vapors are utilized in conjunction with the very pure oxygen described above, it is preferred that flames and sparks be kept out of the reaction chamber to alleviate a risk of fire or explosion.

Although reservoir 50 is shown provided within chamber 12, it is to be understood that the invention encompasses other embodiments wherein reservoir 50 is provided outside of chamber 12, and wherein solvent vapors are flowed into chamber 12 from the external reservoir. Also, the invention encompasses embodiments wherein vapors are provided in a gas source external of chamber 12 (such as, for example, a tank of gas), and piped into chamber 12.

Organic solvent vapors are found to assist in removal of organic materials 19 (such as, for example, photoresist) from over semiconductor substrates. A possible mechanism is that the vapors may "wet" or otherwise improve susceptibility of an organic material 19 to ozone or reactive fragments formed from ozone. Such mechanism is provided to assist in understanding the present invention, and is not to limit the claims except to the extent that the mechanism is expressly recited within a claim.

Figure 2:
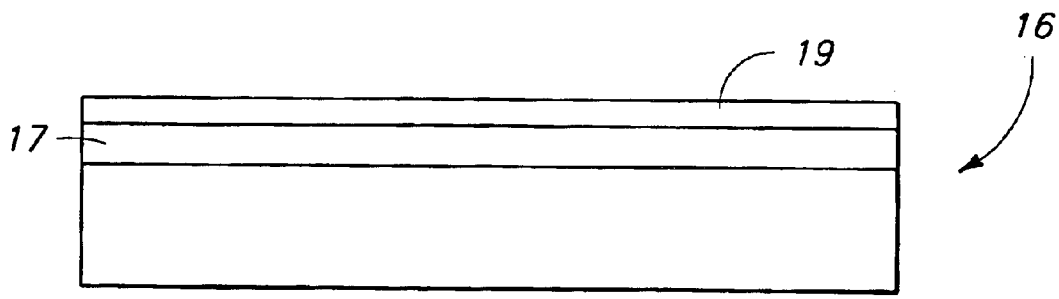
FIG. 2 is a diagrammatic, cross-sectional, fragmentary view of a semiconductor wafer fragment at a preliminary processing step of a method of the present invention.
Figure 3:
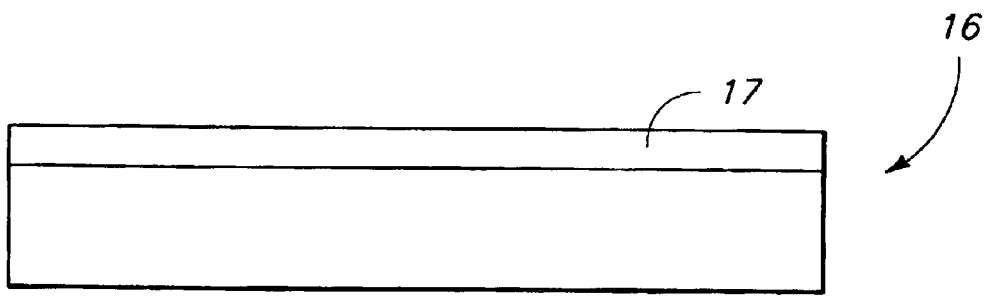
FIG. 3 is a view of the FIG. 2 wafer fragment shown at a processing step subsequent to that of FIG. 2.

FIGS. 2 and 3 illustrate enlarged views of the semiconductor substrate 16 at processing steps of a method of the present invention. FIG. 2 illustrates semiconductor substrate 16 having material 19 thereover. Specifically, material 19 is over a layer 17. As discussed above, layer 19 can comprise an organic material such as, for example, photoresist. Layer 17 can comprise an inorganic material such as, for example, aluminum oxide or platinum.

Referring to FIG. 3, semiconductor substrate 16 is illustrated after material 19 has been removed from over layer 17. Such removal can be accomplished by the processing described above with reference to FIG. 1, wherein ozone (or a reactive fragment generated from ozone) is contacted with material 19 to remove material 19. It is noted that some of layer 17 can be exposed to the ozone, or ozone fragments, during removal of material 19. In accordance with an embodiment of the present invention, the ozone preferably will be formed from an oxygen feed material that comprised less than 0.001% nitrogen. Accordingly, any concentration of nitrous oxides or reactive products formed from a nitrous oxides will be lower in methods of the present invention than in prior art processes. Accordingly, if layer 17 comprises aluminum oxide, platinum, or other materials which can be etched or otherwise corroded by nitrous oxide or products thereof, methods of the present invention can alleviate such corrosion relative to prior art methods.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of removing at least some of a material from a semiconductor substrate, comprising:

providing a feed gas comprising at least 99.999% $O_2$ (by volume);

in an absence of additionally added gases, feeding the feed gas through an ozone generator to generate ozone from the feed gas; and contacting the ozone or a fragment of the ozone with a material on a semiconductor substrate to remove at least some of the material from the semiconductor substrate.

2. The method of claim 1 further comprising irradiating at least some of the ozone with ultraviolet light prior to the contacting.

3. The method of claim 1 further comprising irradiating at least some of the ozone with ultraviolet light proximate the material.

4. The method of claim 1 wherein the material on the semiconductor substrate is photoresist.

5. The method of claim 1 further comprising mixing the ozone with water vapor prior to the contacting.

6. The method of claim 1 further comprising mixing the ozone with an organic solvent vapor prior to the contacting.

7. A method of removing at least some of a material from a semiconductor substrate, comprising:

providing a feed gas comprising 99.999% $O_2$ and less than or equal to 0.001% $N_2$ (by volume);

in an absence of additionally added gases, feeding the feed gas through an ozone generator to generate ozone from the feed gas;

forming a mixture of ozone and organic solvent vapors in a reaction chamber; and contacting at least some of the ozone and solvent vapors with a material on a semiconductor substrate to remove at least some of the material from the semiconductor substrate.

8. The method of claim 7 wherein the material on the semiconductor substrate is photoresist.

9. The method of claim 7 wherein the material on the semiconductor substrate is photoresist; wherein the semiconductor substrate comprises $Al_2O_3$; and further comprising exposing at least some of the $Al_2O_3$ to the ozone during the contacting.

10. The method of claim 7 wherein the material on the semiconductor substrate is photoresist; wherein the semiconductor substrate comprises platinum; and further comprising exposing at least some of the platinum to the ozone during the contacting.

11. The method of claim 7 further comprising providing a reservoir of volatile organic solvent within the reaction chamber and forming the solvent vapors from the volatile organic solvent.

12. The method of claim 11 wherein the volatile organic solvent is a liquid.

13. The method of claim 11 wherein the volatile organic solvent comprises acetone.

14. The method of claim 11 wherein the volatile organic solvent consists essentially of acetone.

15. The method of claim 11 wherein the volatile organic solvent comprises cyclohexanone.

16. The method of claim 11 wherein the volatile organic solvent consists essentially of cyclohexanone.

17. The method of claim 11 wherein the volatile organic solvent comprises a mixture of cyclohexanone and PGMEA.

18. The method of claim 11 wherein the volatile organic solvent comprises propylene glycol.

19. The method of claim 7 further comprising providing a reservoir of volatile organic solvent within the reaction chamber and heating the volatile organic solvent to form the solvent vapors from the volatile organic solvent.

20. A method of removing at least some of a material from a semiconductor substrate, comprising:

providing a feed gas comprising 99.999% $O_2$ and less than or equal to 0.001% $N_2$ (by volume);

in an absence of additionally added gases, feeding the feed gas through an ozone generator to generate ozone from the feed gas;

forming a mixture of ozone and organic solvent vapors in a reaction chamber;

irradiating at least some of the ozone with ultraviolet light to form ozone fragments from the ozone; and contacting at least some of the ozone fragments and solvent vapors with a material on a semiconductor substrate to remove at least some of the material from the semiconductor substrate.

21. The method of claim 20 wherein the material on the semiconductor substrate is photoresist.

22. The method of claim 20 further comprising providing a reservoir of volatile organic solvent within the reaction chamber and forming the solvent vapors from the volatile organic solvent.

23. The method of claim 22 wherein the volatile organic solvent is a liquid.

24. The method of claim 22 wherein the volatile organic solvent comprises acetone.

25. The method of claim 22 wherein the volatile organic solvent comprises cyclohexanone.

26. The method of claim 22 wherein the volatile organic solvent comprises a mixture of cyclohexanone and PGMEA.

27. The method of claim 22 wherein the volatile organic solvent comprises propylene glycol.

28. The method of claim 20 further comprising providing a reservoir of volatile organic solvent within the reaction chamber and heating the volatile organic solvent to form the solvent vapors from the volatile organic solvent.

29. The method of claim 20 wherein the material on the semiconductor substrate is photoresist; wherein the semiconductor substrate comprises $Al_2O_3$; and further comprising exposing at least some of the $Al_2O_3$ to the ozone fragments during the contacting.

30. The method of claim 20 wherein the material on the semiconductor substrate is photoresist; wherein the semiconductor substrate comprises platinum; and further comprising exposing at least some of the platinum to the ozone fragments during the contacting.

\* \* \* \* \*